(12) United States Patent
Chang et al.

(10) Patent No.: US 11,011,601 B2
(45) Date of Patent: May 18, 2021

(54) NARROW GAP DEVICE WITH PARALLEL RELEASING STRUCTURE (71) Applicant: Taiwan Semiconductor Manufacturing Co., Ltd., Hsin-Chu (TW)

(72) Inventors: Kuei-Sung Chang, Kaohsiung (TW); Te-Hao Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/583,152

(22) Filed: Sep. 25, 2019

(65) Prior Publication Data
US 2020/0020764 A1    Jan. 16, 2020

Related U.S. Application Data (62) Division of application No. 13/921,273, filed on Jun. 19, 2013, now Pat. No. 10,497,776.

(51) Int. Cl.
*H01L 29/06*     (2006.01)
*B81C 1/00*      (2006.01)
*H01L 21/78*     (2006.01)

(52) U.S. Cl.
CPC .......... *H01L 29/06* (2013.01); *B81C 1/00619* (2013.01); *H01L 21/7813* (2013.01); *B81B 2203/033* (2013.01)

(58) Field of Classification Search
CPC ................. H01L 29/06; H01L 2224/11–11916
See application file for complete search history.

(56) References Cited

U.S. PATENT DOCUMENTS

2005/0156260 A1* 7/2005 Partridge ............ B81C 1/00301
                                                                257/414
2006/0027891 A1* 2/2006 Ma ...................... B81C 1/00126
                                                                257/522

(Continued)

OTHER PUBLICATIONS

Non-Final Office Action dated Mar. 20, 2015 for U.S. Appl. No. 13/921,273.

(Continued)

*Primary Examiner* — Marcos D. Pizarro
*Assistant Examiner* — Quinton A Brasfield
(74) *Attorney, Agent, or Firm* — Eschweiler & Potashnik, LLC (57) ABSTRACT The present disclosure, in some embodiments, relates to a semiconductor structure. The semiconductor structure includes a substrate. As viewed from a top-view, the substrate has a first sidewall, one or more second sidewalls, and a plurality of third sidewalls. The first sidewall extends along a first direction and defines a first side of a trench. The one or more second sidewalls extends along the first direction and define a second side of the trench. The plurality of third sidewalls are oriented in parallel and extends in a second direction perpendicular to the first direction. The plurality of third sidewalls protrude outward from the second side of the trench and define a plurality of parallel releasing openings that are separated along the first direction by the substrate. The trench continuously extends in opposing directions past the plurality of parallel releasing openings.

20 Claims, 8 Drawing Sheets (56) References Cited

U.S. PATENT DOCUMENTS

| | | | |
|---|---|---|---|
| 2006/0185980 A1* | 8/2006 | Fukuda | G01N 27/128 204/431 |
| 2007/0026636 A1* | 2/2007 | Gogoi | G01C 19/5719 438/456 |
| 2008/0026542 A1* | 1/2008 | Man | H01L 21/76232 438/427 |
| 2010/0176489 A1* | 7/2010 | Ayazi | H01L 28/60 257/595 |
| 2012/0043626 A1* | 2/2012 | Lin | H01L 29/84 257/415 |
| 2014/0179092 A1* | 6/2014 | Kim | H01L 21/28079 438/586 |

OTHER PUBLICATIONS

Final Office Action dated Sep. 30, 2015 for U.S. Appl. No. 13/921,273.
Non-Final Office Action dated Apr. 21, 2016 for U.S. Appl. No. 13/921,273.
Final Office Action dated Nov. 3, 2016 for U.S. Appl. No. 13/921,273.
Notice of Allowance dated Jul. 10, 2019 for U.S. Appl. No. 13/921,273.
Non-Final Office Action dated Jul. 9, 2020 for U.S. Appl. No. 16/583,133.

* cited by examiner

NARROW GAP DEVICE WITH PARALLEL RELEASING STRUCTURE

REFERENCE TO RELATED APPLICATION

This Application is a Divisional of U.S. application Ser. No. 13/921,273, filed on Jun. 19, 2013, the contents of which are hereby incorporated by reference in their entirety.

BACKGROUND

Etching is widely used in the fabrication of integrated chips. Etching is a process by which material is removed from a semiconductor substrate to provide a topology that is used to form one or more layers on the semiconductor substrate. For example, to form a metal interconnect layer, a dielectric material may be formed over a semiconductor substrate and be selectively etched to form a trench in which a metal is subsequently deposited.

Typically, etching is performed by selectively exposing a surface of a semiconductor substrate to an etchant, which removes material from the surface of the semiconductor substrate. The etchant may comprise particles that react with an exposed surface of the semiconductor substrate. For example, a dry etchant may comprise energized particles which collide with an exposed surface of a semiconductor substrate to dislodge atoms from the exposed surface.

BRIEF DESCRIPTION OF THE DRAWINGS

FIGS. 5-12 illustrate some embodiments of a semiconductor substrate upon which a method of etching a narrow gap using a parallel releasing structure is enacted, according to the method of FIG. 4.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

As semiconductor processes advance, semiconductor devices may be formed having increasingly diverse topologies. Narrow gaps (e.g., gaps having a width of between 10 nm and 10 microns) are a common surface topology that is present in many semiconductor devices. For example, MEMS (microelectromechanical) devices, CMOS (complimentary metal-oxide-semiconductor) devices, or any other semiconductor devices may be formed using a narrow gap filled with a sacrificial layer that is subsequently removed.

Since etching is performed by reacting an etchant with an exposed surface of a semiconductor substrate, a rate of etching achievable by an etching process for a narrow gap is limited to a rate that material can be removed in one direction upon which an etchant can enter into the narrow gap. Therefore, as feature sizes are reduced, the etching rate of a narrow gap decreases (increasing processing time) since less etchant can enter into the narrow gap. The low etching rate makes etching a large thickness of material (e.g., microns) from a narrow gap a time consuming process that slows fabrication of a semiconductor device and thereby increases an associated cost of the device.

Accordingly, the present disclosure relates to a method of etching a narrow gap using one or more parallel releasing structures to improve etching performance, and an associated apparatus. In some embodiments, the method comprises providing a semiconductor substrate with a narrow gap with a sacrificial material having an exposed surface. One or more parallel releasing structures are formed within the semiconductor substrate at positions that abut the narrow gap. An etching process is then performed to simultaneously remove the sacrificial material from the narrow gap along a first direction from the exposed surface and a second direction from the one or more parallel releasing structures. By simultaneously etching the sacrificial material from both the direction of the exposed surface and from the direction of the one or more parallel releasing structures, the sacrificial material is removed in less time, since the etch is not limited by a size of the narrow gap.

Figure 1:
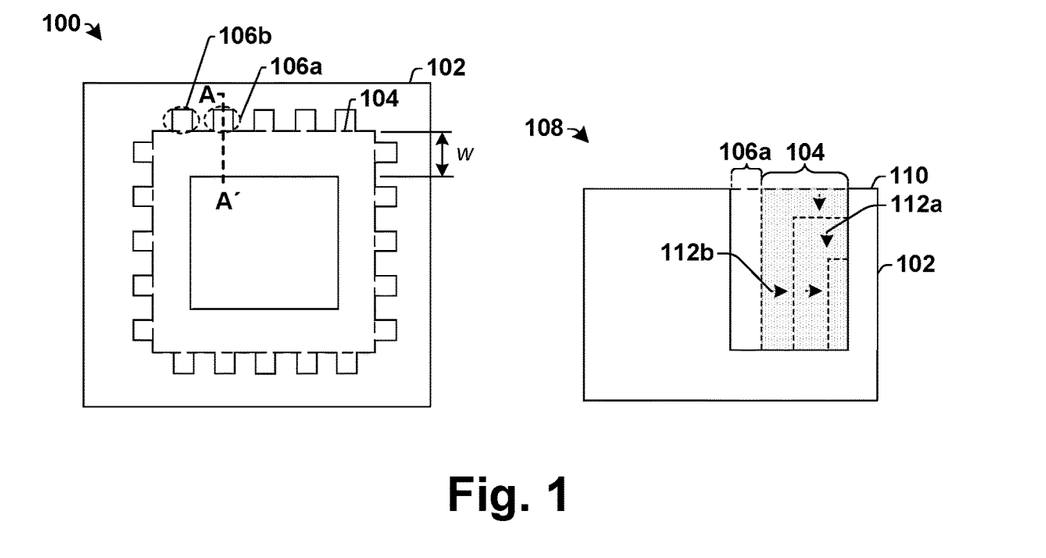
FIG. 1 illustrates some embodiments of a semiconductor substrate having a parallel releasing structure configured to improve etching capabilities of a narrow gap.

FIG. 1 illustrates a top-view 100 and a cross-sectional view 108 of some embodiments of a semiconductor substrate 102 having one or more parallel releasing structures 106 configured to improve etching capabilities of a narrow gap 104 within the semiconductor substrate 102.

The semiconductor substrate 102 has an etching region comprising a narrow gap 104 connected to one or more parallel releasing structures 106. The narrow gap 104 is configured to contain a sacrificial material (e.g., SiO$_2$) that is to be subsequently removed from the narrow gap 104 by a selective etching process. In some embodiments, the narrow gap 104 may be part of a semiconductor device. For example, the narrow gap 104 may be part of a MEMS (microelectromechanical systems) device, a CMOS (Complementary metal-oxide-semiconductor) device, a high-density capacitor for DRAM, or any other semiconductor device having a narrow gap which is filled with a sacrificial layer to be subsequently removed. The narrow gap 104 may have a width w that is in a range of between approximately 10 nanometers and approximately 10 microns.

The one or more parallel releasing structures 106 extend within the semiconductor substrate 102, from the top surface 110 of the semiconductor substrate, to form depressions (i.e., trenches or holes) disposed within the semiconductor substrate 102. The one or more parallel releasing structures 106 abut the narrow gap 104. Since the one or more parallel releasing structures 106 abut the narrow gap 104, the one or more parallel releasing structures 106 provide for an opening along a side of the narrow gap 104 into which an etchant can enter, thereby allowing for the sacrificial material within the narrow gap 104 to be simultaneously etched from multiple directions. For example, in some embodiments, a sacrificial material may be etched along a first direction 112a (e.g., using etchant that contacts the sacrificial material from above the semiconductor substrate 102) and also along a second direction 112b (e.g., using etchant that contacts the sacrificial material from a parallel releasing structure), perpendicular to the first direction 112a. By simultaneously etching sacrificial material within the narrow gap in multiple directions, the time that an etchant takes to remove the sacrificial material can be reduced.

Figure 2:
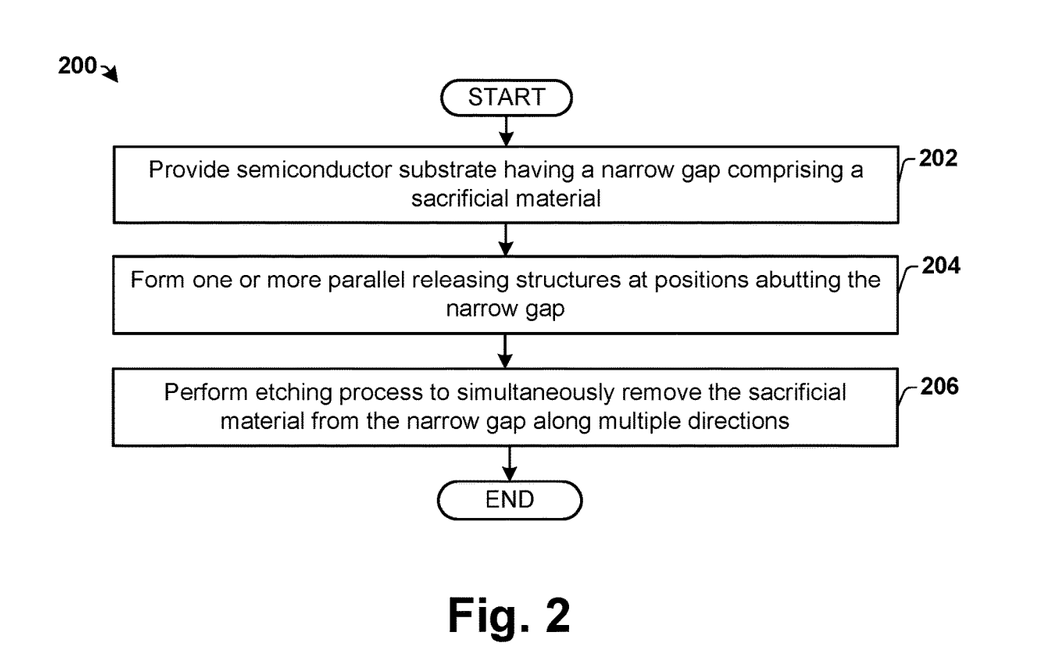
FIG. 2 illustrates a flow chart of some embodiments of a method of etching a narrow gap using a parallel releasing structure.

FIG. 2 illustrates a flow chart of some embodiments of a method 200 of etching a narrow gap within a semiconductor device using one or more parallel releasing structures.

At 202, a semiconductor substrate having a narrow gap comprising a sacrificial material is provided. The narrow gap has an exposed surface parallel to a top surface of the semiconductor substrate.

At 204, one or more parallel releasing structures are formed within the semiconductor substrate at positions that abut the narrow gap. The one or more parallel releasing structures comprise depressions (i.e., trenches or holes) that extend from the top surface of the semiconductor substrate to a position within the semiconductor substrate.

At 206, an etching process is performed to simultaneously remove the sacrificial material from the narrow gap along multiple directions. For example, the semiconductor substrate may be selectively etched to remove the sacrificial material from a first direction along the exposed surface and from a second direction along a surface of the narrow gap abutting the one or more parallel releasing structures.

Figure 3A:
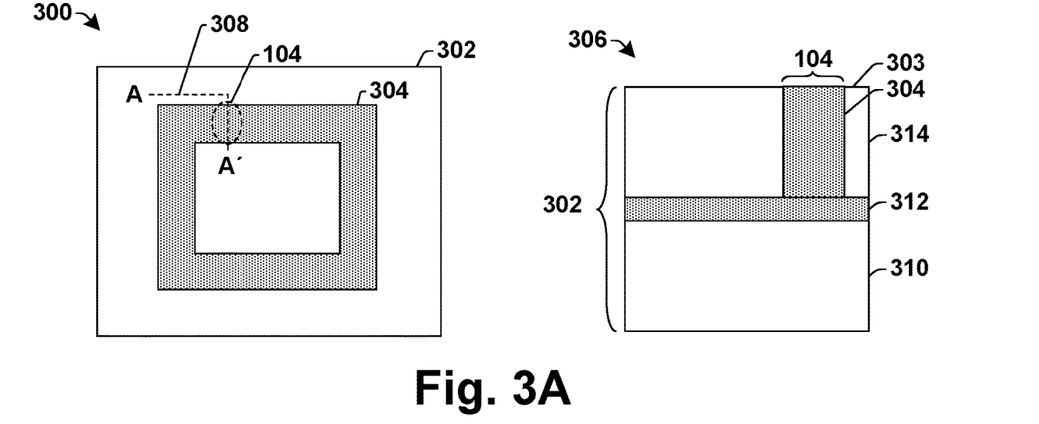
FIGS. 3A-3C illustrate some embodiments of a semiconductor substrate upon which a method of etching a narrow gap using a parallel releasing structure is enacted, according to the method of FIG. 2.
Figure 3B:
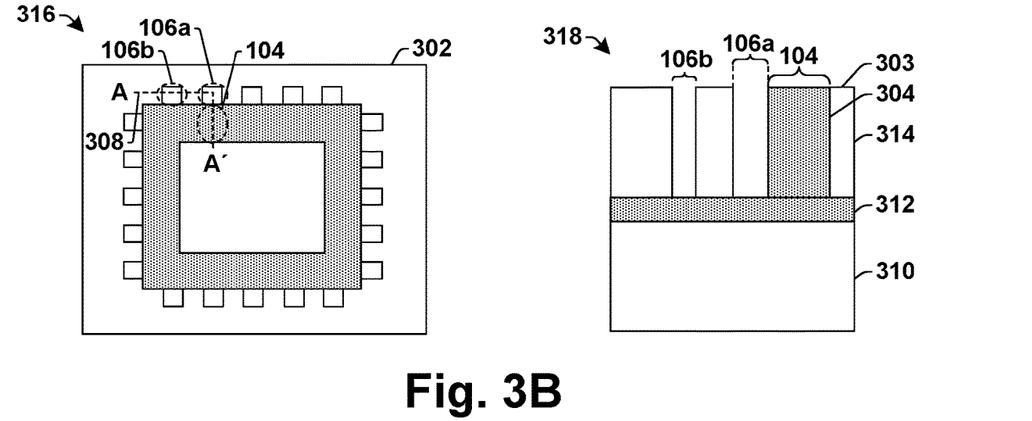
Figure 3C:
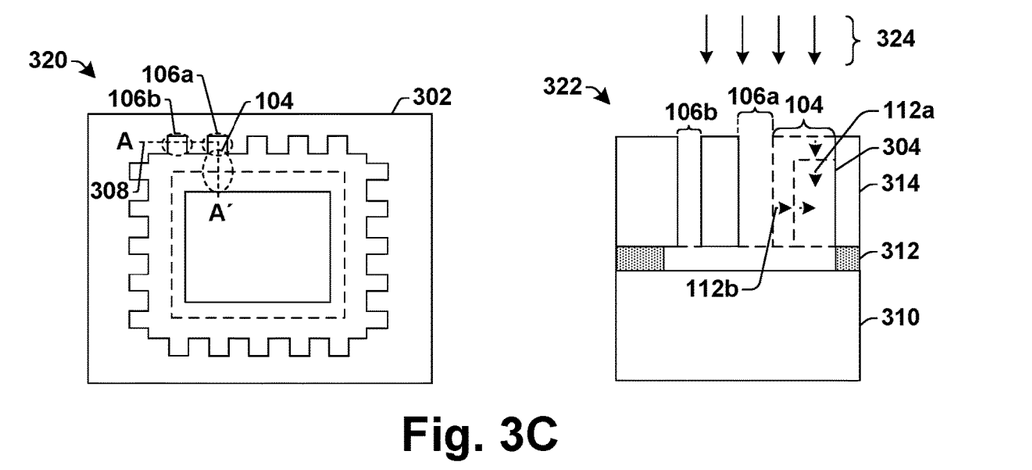

FIGS. 3A-3C illustrate some embodiments of an exemplary semiconductor substrate, whereon a method of etching according to method 200 is implemented. Although FIGS. 3A-3C are described in relation to method 200, it will be appreciated that the structures disclosed in FIGS. 3A-3C are not limited to such a method.

FIG. 3A illustrates some embodiments of a semiconductor substrate 302 corresponding to act 202. FIG. 3A illustrates a top-view 300 of the semiconductor substrate 302 and a cross-sectional view 306 extending along a cross-sectional line 308 passing through a narrow gap 104 comprising a sacrificial material 304.

The semiconductor substrate 302 may comprise any type of semiconductor body 310 (e.g., silicon, silicon-germanium, silicon-on-insulator) such as a semiconductor wafer and/or one or more die on a wafer, as well as any other type of semiconductor and/or epitaxial layers associated therewith. In some embodiments, the semiconductor substrate 302 may comprise a dielectric material layer 312 (e.g., silicon oxide) embedded within the semiconductor substrate 302. For example, the semiconductor substrate 302 may comprise a semiconductor material layer 314 (e.g., an epitaxial layer, a second semiconductor substrate, etc.) formed above the dielectric material layer 312, so that the dielectric material layer 312 is embedded within the semiconductor substrate 302 at a position that is parallel to a top surface 303 of the semiconductor substrate 302. In some embodiments, the semiconductor substrate 302 may also comprise one or more electrical conductive features to transmit electrical signals or powers.

The narrow gap 104 is comprised within the semiconductor substrate 302. The narrow gap 104 comprises a sacrificial material 304 having an exposed surface, which is parallel to the top surface 303 of the semiconductor substrate. In some embodiments, the narrow gap 104 may extend from a top surface 303 of the semiconductor substrate 302 to the underlying dielectric material layer 312.

FIG. 3B illustrates some embodiments of a semiconductor substrate corresponding to act 204. FIG. 3B illustrates a top-view 316 of the semiconductor substrate 302 and a cross-sectional view 318 extending along a cross-sectional line 308 passing through the narrow gap 104 and first and second parallel releasing structures, 106a and 106b.

The first and second parallel releasing structures, 106a and 106b, are formed within the semiconductor substrate 302 at positions that abut the narrow gap 104. In some embodiments, the first and second parallel releasing structures, 106a and 106b, may extend from the top surface 303 of the semiconductor substrate 302 to a top of the dielectric material layer 312. In other embodiments, the first and second parallel releasing structures, 106a and 106b, may extend from the top surface 303 of the semiconductor substrate 302 to a bottom of the dielectric material layer 312. In yet other embodiments, the first and second parallel releasing structures, 106a and 106b, may extend from the top surface 303 of the semiconductor substrate 302 to an alternative position within the semiconductor substrate 302 (e.g. to a bottom of the sacrificial material 304). In some embodiments, the first and second parallel releasing structures, 106a and 106b, are formed by selectively etching the semiconductor substrate 302 with a highly anisotropic etchant.

FIG. 3C illustrates some embodiments of a semiconductor substrate corresponding to act 206. FIG. 3C illustrates a top-view 320 of the semiconductor substrate 302 and a cross-sectional view 322 extending along a cross-sectional line 308.

As shown in top-view 320 and cross-sectional view 322, an etching process is performed to selectively etch the semiconductor substrate 302, using etchant 324, to simultaneously remove sacrificial material 304 from the narrow gap 104 along a first direction 112a and a second direction 112b. The etchant 324 may comprise a wet etchant, a vapor etchant, or a dry etchant. The first direction 112a is normal to the exposure surface of the narrow gap 104 (i.e., using etchant that contacts a top surface of the sacrificial material 304). The second direction 112b is normal to a surface of the narrow gap 104 facing the parallel releasing structure 106 (i.e. using etchant that contacts a side surface of the sacrificial material 304). Simultaneously etching the sacrificial material 304 along multiple directions reduces the time that an etchant takes to remove the sacrificial material 304 from the semiconductor substrate 302.

In some embodiments, the etching time used to remove the sacrificial material 304 from the semiconductor substrate 302 can be controlled by varying the size and/or pitch of the narrow gap 104 and the one or more parallel releasing structures 106. For example, by increasing the size of the narrow gap 104 and/or the one or more parallel releasing structures 106 the etching time used to remove the sacrificial material 304 can be reduced since the larger size of the narrow gap 104 and/or the one or more parallel releasing structures 106 allows for more etchant to interact with the sacrificial material 304.

Figure 4:
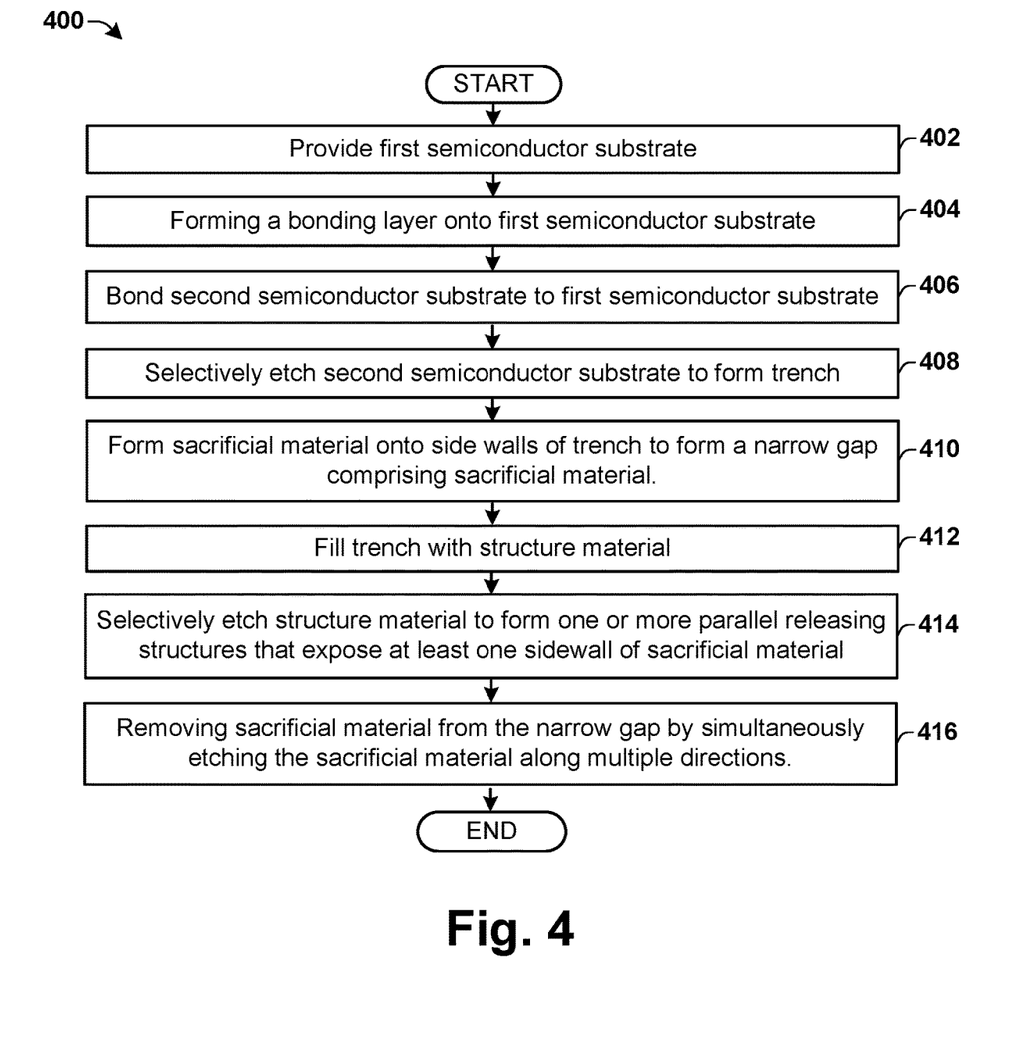
FIG. 4 illustrates a flow chart of some embodiments of a method of etching a narrow gap device having a parallel releasing structure.

FIG. 4 illustrates a flow diagram of some alternative embodiments of a method 400 for etching a narrow gap within a semiconductor device comprising a microelectromechanical systems (MEMS) device using one or more parallel releasing structures.

While the disclosed methods (e.g., methods 200 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a first semiconductor substrate is provided. In some embodiments, the first semiconductor substrate comprises a semiconductor wafer, such as a silicon wafer, for example.

At 404, a bonding layer is deposited onto the first semiconductor substrate. The bonding layer comprises a layer that enables bonding of a second semiconductor substrate onto the first semiconductor substrate.

At 406, the second semiconductor substrate is bonded to the first semiconductor substrate. The second semiconductor substrate is bonded to the first semiconductor substrate by bringing the second semiconductor substrate into contact with the first semiconductor substrate at an interface comprising the bonding layer.

At 408, the second semiconductor substrate is selectively etched to form a trench. The trench may extend from a top surface of the semiconductor substrate to the underlying bonding layer.

At 410, a sacrificial material is formed onto sidewalls of the trench. Forming the sacrificial material onto sidewalls of the trench results in the formation of a narrow gap comprising the sacrificial material. Formation of the sacrificial material onto side walls of the trench may be performed by depositing one or more sacrificial layers of silicon dioxide using a thermal oxidization process.

At 412, the trench is filled with a structure material. In some embodiments, the structure material may comprise polysilicon.

At 414, the structure material is selectively etched to form one or more parallel releasing structures that expose the sacrificial material on at least one of the side walls of the trench. For example, in some embodiments the structure material may be selectively etched to form a parallel releasing structure comprising a depression (i.e., a hole or a trench) that exposes the sacrificial material on one sidewall of the trench.

At 416, the sacrificial material is removed from the narrow gap by simultaneously etching the sacrificial material along multiple directions. In various embodiments, the sacrificial material may be selectively etched using a wet etch or a dry etch (e.g., a vapor etch, a plasma etch, etc.). Since the parallel releasing structures expose a sidewall of the sacrificial material, the etching simultaneously removes the sacrificial material along multiple directions.

FIGS. 5-12 illustrate some embodiments of an exemplary semiconductor substrate, whereon a method of etching according to method 400 is implemented. Although FIGS. 5-12 are described in relation to method 400, it will be appreciated that the structures disclosed in FIGS. 5-12 are not limited to such a method, but instead may stand alone as a structure.

Figure 5:
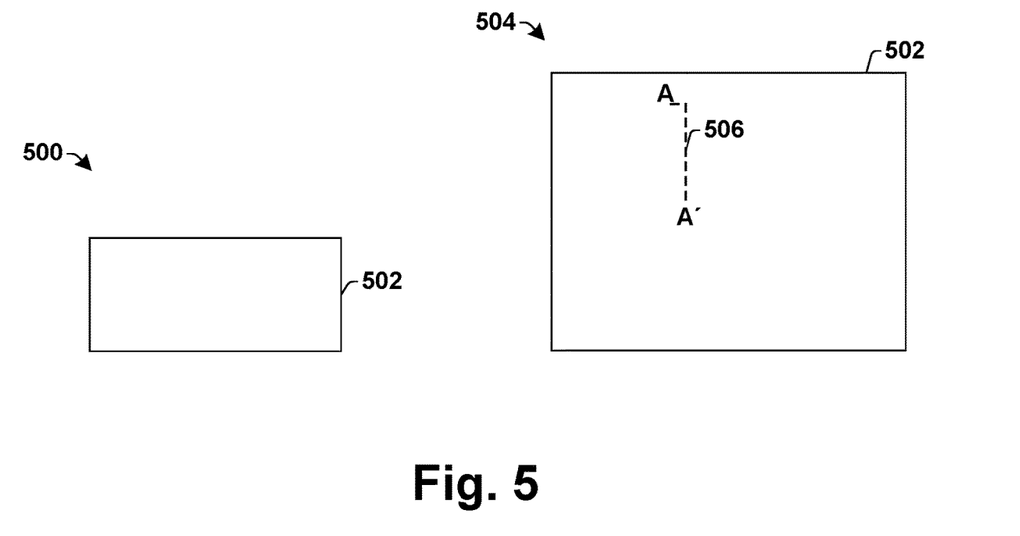

FIG. 5 illustrates some embodiments of a first semiconductor substrate 502 corresponding to act 402. FIG. 5 illustrates a top-view 504 of the first semiconductor substrate 502 and a cross-sectional view 500 extending along a cross-sectional line 506. In some embodiments, the first semiconductor substrate 502 comprises a semiconductor wafer, such as a silicon wafer, for example.

Figure 6:
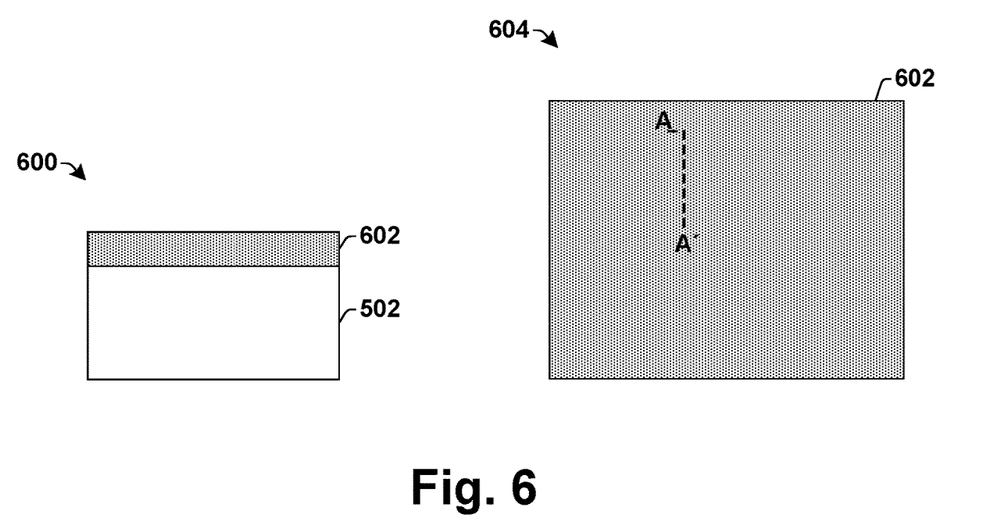

FIG. 6 illustrates some embodiments of a cross-sectional view 600 and a top-view 604 corresponding to act 404. As shown, a bonding layer 602 is formed over the first semiconductor substrate 502. The bonding layer 602 may comprise silicon oxide. In some embodiments, the bonding layer 602 may be formed by a thermal process. In other embodiments, the bonding layer 602 may be formed onto the semiconductor substrate 502 by way of a deposition technique (e.g., chemical vapor deposition, physical vapor deposition, etc.) or an epitaxial growth.

Figure 7:
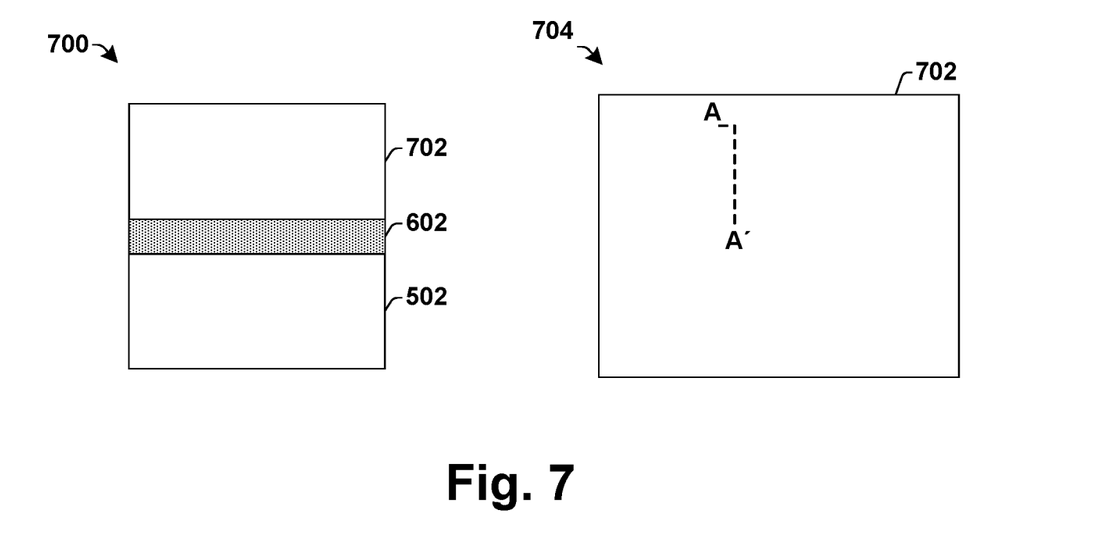

FIG. 7 illustrates some embodiments of a cross-sectional view 700 and a top-view 704 corresponding to act 406. As shown, a second semiconductor substrate 702 is bonded to the first semiconductor substrate 502 by bringing the second semiconductor substrate 702 into contact with the first semiconductor substrate 502 at an interface comprising the bonding layer 602. In some embodiments, the second semiconductor substrate 702 (e.g., a silicon wafer) may be bonded to the first semiconductor substrate 502 by way of a fusion bonding process that bonds the first and second semiconductor substrates, 502 and 702, together using a bonding layer 602 comprising an oxide material. In other embodiments, alternative bonding processes may be used.

Figure 8:
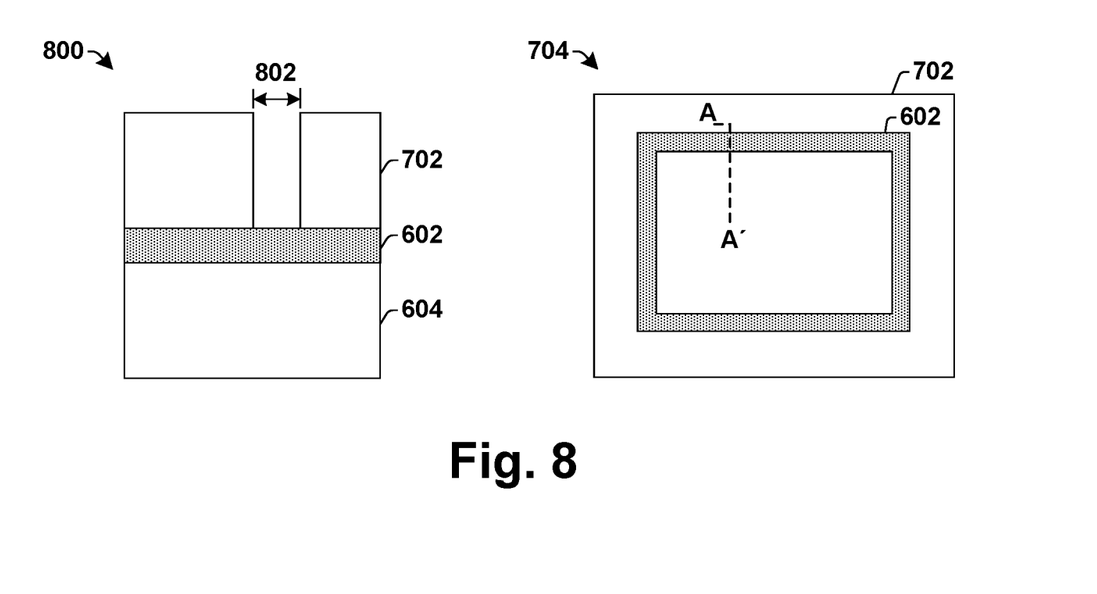

FIG. 8 illustrates some embodiments of a cross-sectional view 800 and a top-view 804 corresponding to act 408. As shown, the second semiconductor 702 is selectively etched to form a trench 802 that extends through the second semiconductor substrate 702 to the bonding layer 602. In some embodiments, the trench 802 is formed by a deep reactive ion etching process. The deep reactive ion etching process is a highly anisotropic etch that forms steep-sided holes and trenches with high aspect ratios.

Figure 9:
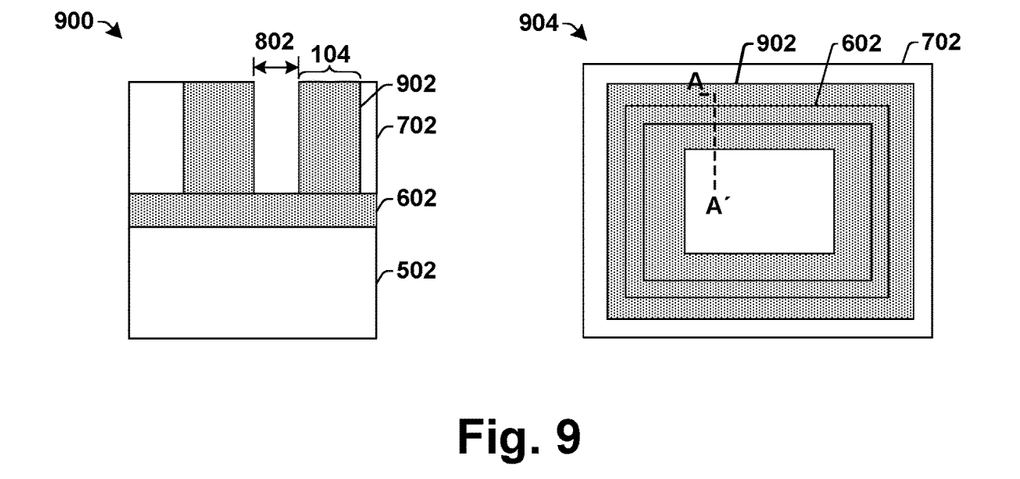

FIG. 9 illustrates some embodiments of a cross-sectional view 900 and a top-view 904 corresponding to act 410. As shown, a sacrificial material 902 is formed onto side walls of the trench 802, resulting in narrow gaps 104 comprising the sacrificial material 902. The narrow gaps 104 may have a width that is between 10 nm and 10 microns. Formation of the sacrificial material 902 onto the side wall of the trench 802 may be performed by depositing one or more layers of silicon dioxide (e.g., $SiO_2$) using a thermal oxidization process.

Figure 10:
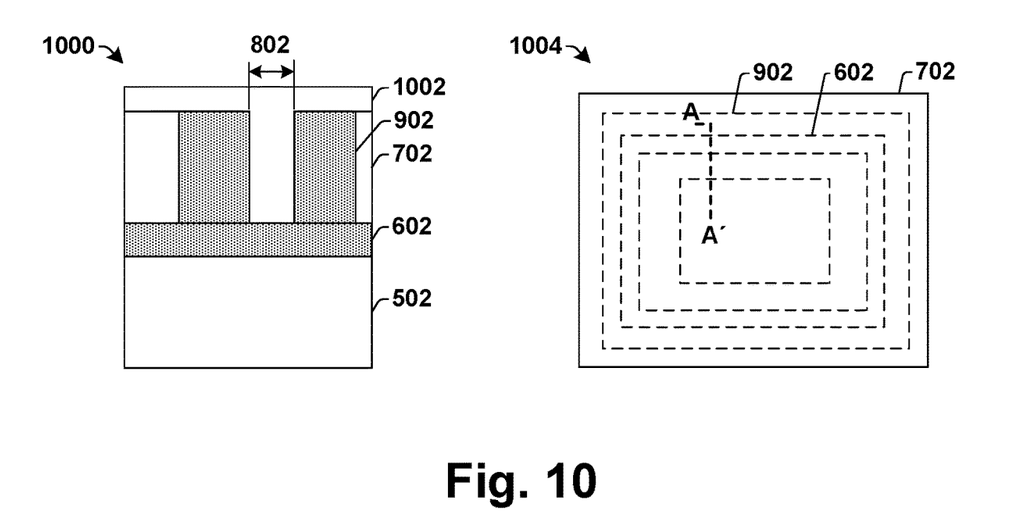

FIG. 10 illustrates some embodiments of a cross-sectional view 1000 and a top-view 1004 corresponding to act 412. As shown, the trench 802 is filled with a structure material 1002 (e.g., polysilicon). The structure material 1002 may be formed by way of a deposition technique (e.g., chemical vapor deposition, physical vapor deposition, etc.) or an epitaxial growth.

Figure 11A:
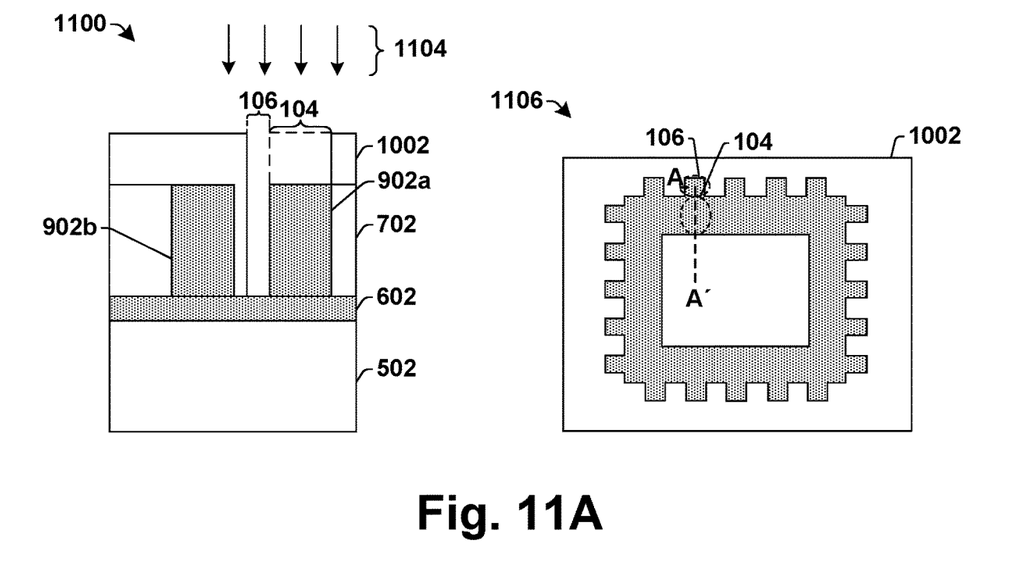

FIG. 11A illustrates some embodiments of a cross-sectional view 1100 and a top-view 1106 corresponding to act 414. As shown, the structure material 1002 is selectively etched, by an etchant 1104. The etchant 1104 removes the structure material 1002 to form one or more parallel releasing structures 106 that expose at least one sidewall of the sacrificial material 902. The etchant 1104 also removes the structure material 1002 from above the sacrificial material 902 to form an exposed top surface of the sacrificial material 902 within the narrow gap 104.

Figure 11B:
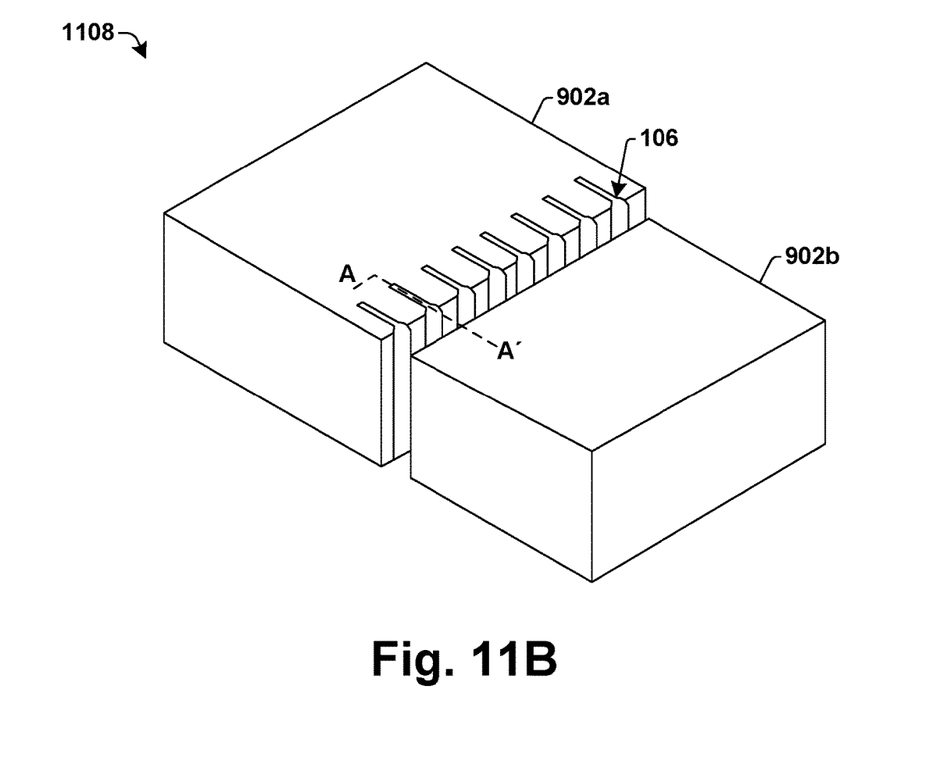

FIG. 11B illustrates a three-dimensional view 1108 corresponding to act 414. As shown in the three-dimensional view 1108, the one or more parallel releasing structures 106 extend between portions of the sacrificial material 902a and 902b. In some embodiments, to increase etching within the one or more parallel releasing structure 106 the portions of sacrificial material, 902a and 902b, may be separated from one another, as shown.

Figure 12:
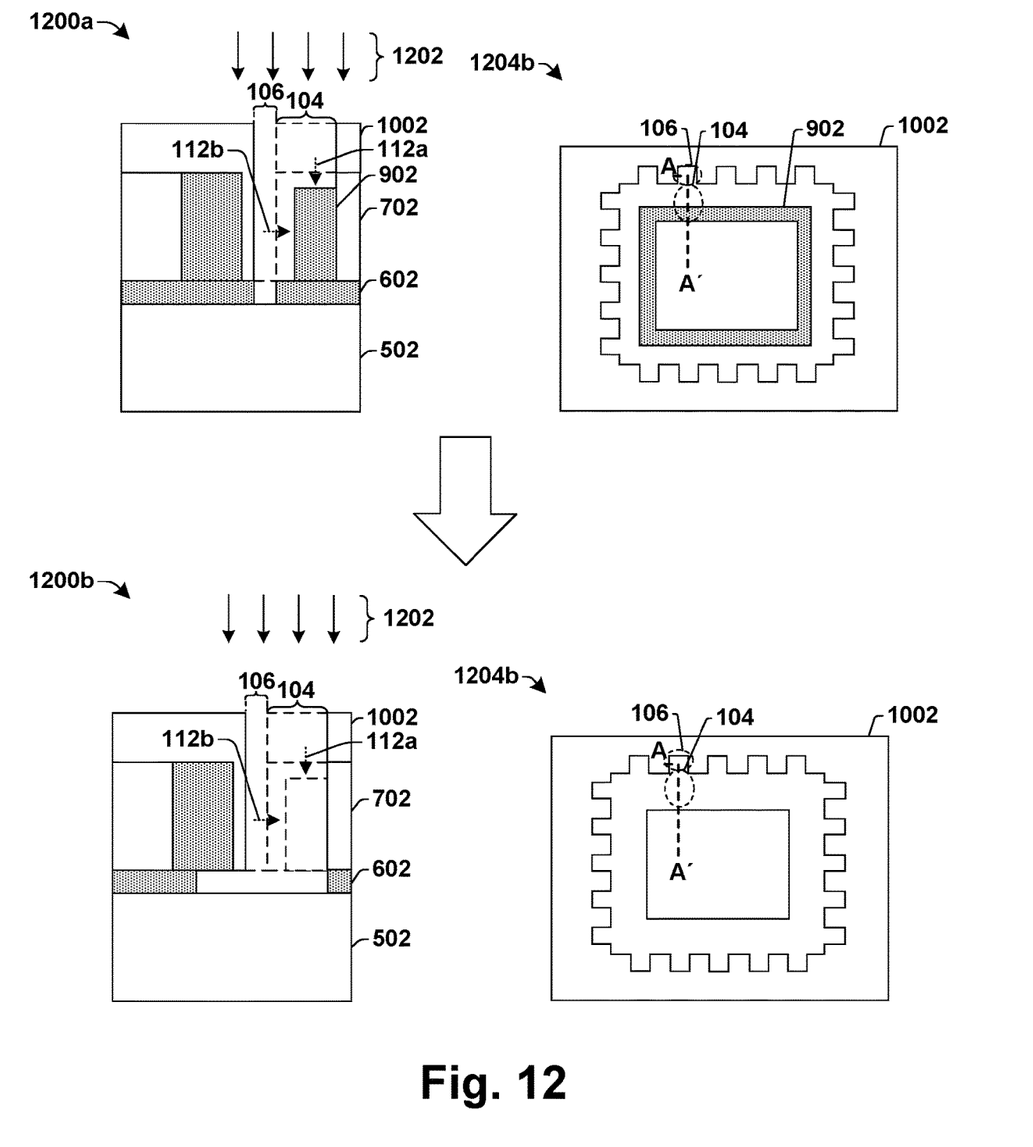

FIG. 12 illustrates some embodiments of a cross-sectional view 1200 and a top-view 1204 corresponding to act 416. As shown in cross-sectional view 1200a, the sacrificial material 902 is selectively etched, by an etchant process using etchant 1202, to simultaneously remove the sacrificial material 902 from the semiconductor substrate along multiple directions. For example, the etchant 1202 simultaneously removes the sacrificial material 902 along a first direction 112a and along a second direction 112b, parallel to the first direction 112a. As shown in cross-sectional view 1200b, the etching process proceeds until the sacrificial material 902 has been removed from the semiconductor substrate. In various embodiments, the etchant 1202 may comprise a wet etchant, a vapor etchant, or a dry etchant. For example, in some embodiments, the etchant 1202 may comprise a wet etchant or a vapor etchant comprising hydrogen fluoride (HF). In other embodiments, the etchant 1202 may comprise a dry etchant having an etching chemistry comprising $CF_4$ (Tetrafluoromethane), $CHF_3$ (Trifluoromethane), or $C_2F_6$ (Hexafluoroethane), for example.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of etching a narrow gap using one or more parallel releasing structures to improve etching performance, and an associated apparatus.

In some embodiments, the present disclosure relates to a method of etching a narrow gap within a semiconductor substrate. The method comprises providing a semiconductor substrate having a narrow gap comprising a trench filled with a sacrificial material having an exposed surface. The method further comprises forming one or more parallel releasing structures within the semiconductor substrate, wherein the one or more parallel releasing structures comprise depressions within the semiconductor substrate located at positions that abut the sacrificial material within the narrow gap. The method further comprises performing an etching process to simultaneously remove the sacrificial material from the narrow gap along multiple directions.

In other embodiments, the present disclosure relates to a method of etching a narrow gap within a semiconductor substrate. The method comprises providing a first semiconductor substrate. The method further comprises forming a bonding layer onto the first semiconductor substrate and bonding a second semiconductor substrate to the first semiconductor substrate at an interface comprising the bonding layer. The method further comprises selectively etching the second semiconductor substrate to form a trench within the second semiconductor substrate and forming sacrificial material onto sidewalls of the trench, resulting in a narrow gap comprising the sacrificial material. The method further comprises forming one or more parallel releasing structures within the semiconductor substrate, wherein the one or more parallel releasing structures comprise depressions within the semiconductor substrate located at positions that abut the sacrificial material within the narrow gap. The method further comprises removing the sacrificial material from the narrow gap by simultaneously etching the sacrificial material along multiple directions.

In other embodiments, the present disclosure relates to a semiconductor device. The semiconductor device comprises a semiconductor substrate. The semiconductor device further comprises a narrow gap comprising a sacrificial material. The narrow gap extends within the semiconductor substrate, to form trenches or holes disposed within the semiconductor substrate. The semiconductor device further comprises one or more parallel releasing structures that extend within the semiconductor substrate to form depressions within the semiconductor substrate that abut the narrow gap. The one or more parallel releasing structures provide for an opening along a side of the narrow gap into which an etchant can enter, thereby allowing for the sacrificial material within the narrow gap to be simultaneously etched from multiple directions.

What is claimed is:

1. A semiconductor structure, comprising:
    a substrate, wherein as viewed from a top-view the substrate comprises:
        a first sidewall extending along a first direction and defining a first side of a trench;
        one or more second sidewalls extending along the first direction and defining a second side of the trench opposing the first side of the trench;
        a plurality of third sidewalls coupled to the one or more second sidewalls and extending-away from the first sidewall in a second direction perpendicular to the first direction, wherein the plurality of third sidewalls protrude outward from the second side of the trench and define a plurality of parallel releasing openings that are separated along the first direction by the substrate; and
    wherein the first sidewall continuously extends in opposing directions past the plurality of parallel releasing openings.

2. The semiconductor structure of claim 1, wherein the substrate comprises:
    a first semiconductor substrate;
    a first dielectric layer over the first semiconductor substrate; and
    a second semiconductor substrate over the first dielectric layer, wherein the trench is defined by sidewalls of the second semiconductor substrate and vertically extends from a top of the second semiconductor substrate to the first dielectric layer.

3. The semiconductor structure of claim 1, wherein the substrate further comprises:

a sacrificial material disposed along the one or more second sidewalls of the substrate.

4. The semiconductor structure of claim 3, wherein the substrate further comprises:
a structure material disposed along a sidewall of the sacrificial material and directly over an upper surface of the sacrificial material.

5. The semiconductor structure of claim 1, wherein the trench extends in an unbroken loop around a region of the substrate.

6. The semiconductor structure of claim 1, wherein the first sidewall and the one or more second sidewalls are coupled to a horizontally extending surface that is completely confined between the first sidewall and the one or more second sidewalls and that defines a bottom of the trench.

7. The semiconductor structure of claim 1, wherein the trench is comprised within a semiconductor device comprising a MEMS (microelectromechanical systems) device or a CMOS (complementary metal-oxide-semiconductor) device.

8. A semiconductor structure, comprising:
a substrate comprising a semiconductor material, the substrate including:
a first plurality of sidewalls defining a trench within the substrate, wherein the first plurality of sidewalls are disposed along a first path that extends in a first closed loop having a substantially square shape comprising four outer sides;
a second plurality of sidewalls defining the trench within the substrate, wherein the second plurality of sidewalls extend along opposing sides of the first closed loop; and
a third plurality of sidewalls protruding outward from the second plurality of sidewalls away from the first plurality of sidewalls and away from the second plurality of sidewalls, wherein the second plurality of sidewalls define a plurality of releasing openings protruding outward from the trench.

9. The semiconductor structure of claim 8, wherein the trench continuously extends in an unbroken ring around the first plurality of sidewalls past the plurality of releasing openings.

10. The semiconductor structure of claim 8, wherein the third plurality of sidewalls extend outward from the second plurality of sidewalls in a first direction and in a second direction that is perpendicular to the first direction, the first direction and the second direction parallel to an upper surface of the substrate.

11. The semiconductor structure of claim 8, wherein the substrate comprises:
a first semiconductor substrate;
a dielectric over the first semiconductor substrate; and
a second semiconductor substrate over the dielectric, wherein the trench continuously extends between a top of the second semiconductor substrate and the dielectric.

12. The semiconductor structure of claim 11, wherein the substrate further comprises:
a sacrificial material disposed along a sidewall of the second semiconductor substrate.

13. The semiconductor structure of claim 12, wherein the substrate further comprises:
a structure material disposed along a sidewall of the sacrificial material and over the sacrificial material.

14. The semiconductor structure of claim 13, wherein the sacrificial material continuously extends between the structure material and the second semiconductor substrate.

15. A semiconductor structure, comprising:
a first semiconductor substrate;
a dielectric material over the first semiconductor substrate;
a second substrate over the dielectric material, wherein sidewalls of the second substrate define an opening; and
wherein as viewed from a top-view the opening has a shape comprising a first edge that extends along a substantially straight line and an opposing second edge that extends along a wave having a plurality of repeating segments, the substantially straight line continuously extends past multiple repeating segments of the plurality of repeating segments.

16. The semiconductor structure of claim 15,
wherein the opening has a plurality of different widths measured along a first direction that is perpendicular to a second direction along which the substantially straight line extends;
wherein the plurality of different widths comprise a first width, a second width larger than the first width, a third width smaller than the second width, and a fourth width larger than the third width; and
wherein the second width is between the first width and the third width and the third width is between the second width and the fourth width along the second direction and wherein the substantially straight line continuously extends past the first width, the second width, the third width, and the fourth width.

17. The semiconductor structure of claim 15, wherein as viewed from the top-view the second substrate comprises:
a first sidewall defining a first side of a trench;
one or more second sidewalls extending in parallel to the first sidewall and defining a second side of the trench; and
a plurality of third sidewalls defining a plurality of parallel releasing openings that protrude outward from the second side of the trench and away from the first sidewall, wherein the first sidewall continuously extends past opposing sides of multiple ones of the plurality of parallel releasing openings.

18. The semiconductor structure of claim 17, wherein the first sidewall, the one or more second sidewalls, and the plurality of third sidewalls extend between a top surface and a bottom surface of the second substrate.

19. The semiconductor structure of claim 17, wherein the plurality of third sidewalls have substantially equal lengths.

20. The semiconductor structure of claim 15, wherein the shape continuously extends in an unbroken loop around a central region of the second substrate and wherein the first edge is between the opposing second edge and the central region of the second substrate.

\* \* \* \* \*